(12) United States Patent
Richards et al.

(10) Patent No.: US 7,253,629 B1
(45) Date of Patent: Aug. 7, 2007

(54) CIRCUIT PROTECTION DEVICE WITH GROUNDED NEUTRAL HALF CYCLE SELF TEST

(75) Inventors: Jeffrey C. Richards, Baldwinsville, NY (US); David A. Finlay, Sr., Marietta, NY (US); Bruce F. Macbeth, Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 654 days.

(21) Appl. No.: 10/768,530

(22) Filed: Jan. 30, 2004

Related U.S. Application Data

(63) Continuation-in-part of application No. 09/725,525, filed on Nov. 29, 2000, now Pat. No. 6,674,289.

(51) Int. Cl.
*G01R 31/327* (2006.01)
*G01R 31/14* (2006.01)

(52) U.S. Cl. ............... 324/424; 324/509; 324/510; 324/523; 324/527; 361/42; 361/63

(58) Field of Classification Search .......... 324/424, 324/509, 510, 523, 527; 361/42, 63
See application file for complete search history.

(56) References Cited

U.S. PATENT DOCUMENTS 5,459,630 A * 10/1995 MacKenzie et al. .......... 361/45
6,472,882 B1 * 10/2002 Tiemann et al. ............ 324/509

* cited by examiner

*Primary Examiner*—Anjan Deb
(74) *Attorney, Agent, or Firm*—Daniel P. Malley; Bond, Schoeneck & King PLLC

(57) ABSTRACT

The present invention is directed to a circuit and method for self-testing a protection device for use in an AC power distribution system. The device is configured to be coupled between an AC power distribution system and at least one load. The method includes the step of introducing a simulated ground neutral fault during a first predetermined half cycle half cycle of the AC power. An attempt is made to detect the introduced simulated grounded neutral fault during the first predetermined half cycle half cycle. A fault condition is signaled if the introduced simulated grounded neutral fault is not detected within a predetermined period of time.

39 Claims, 6 Drawing Sheets ately to the load terminals of the GFCI, the visual indicator is actuated to display the mis-wire alarm condition. Those of ordinary skill in the art will understand that a mis-wire condition of this type will result in a loss of GFCI protection at the duplex receptacles on the face of the GFCI. One drawback to this approach is that the GFCI does not include a self-test of the electrical circuit. Another drawback to this approach is that the visual display does not indicate a lock-out of load side power by the interrupting contacts. As such, the user is obliged to correctly interpret and take action based on appearance of the visual indicator.

CIRCUIT PROTECTION DEVICE WITH GROUNDED NEUTRAL HALF CYCLE SELF TEST

CROSS-REFERENCE TO RELATED APPLICATIONS

This is a continuation-in-part of U.S. patent application Ser. No. 09/725,525 filed on Nov. 29, 2000, now U.S. Pat. No. 6,674,289 B2, issued Jan. 6, 2004 the content of which is relied upon and incorporated herein by reference in its entirety, and the benefit of priority under 35 U.S.C. §120 is hereby claimed.

BACKGROUND OF THE INVENTION

1. Field of the Invention

The present invention relates generally to circuit protection devices, and particularly to self-testing circuit protection devices.

2. Technical Background

Circuit protection devices are configured to interrupt the flow of electrical power to a load circuit when certain fault conditions. Two of the most common types of circuit protection devices are arc-fault circuit interrupters (AFCIs) and ground-fault circuit interrupters (GFCIs). AFCI and GFCI protection may be included together in one protective device.

An arc fault is a discharge of electricity between two or more conductors. An arc fault may be caused by damaged insulation on the hot or neutral line conductors, or both. The damaged insulation may cause a low power arc between the two conductors and fire may result. An AFCI is configured to detect the arcing condition and de-energize the electrical circuit.

A ground fault occurs when a current carrying (hot) conductor contacts ground. This creates an unintended current path that represents an electrical shock hazard. A ground fault creates an unintended current path that may also lead to fire. GFCIs intended to prevent fire have been called ground-fault equipment protectors (GFEPs.)

A ground fault may occur for several reasons. If the wiring insulation within a piece of equipment becomes damaged, a user may contact the hot conductor and ground at the same time, creating a shock hazard for a user. A ground fault may also occur when the equipment comes in contact with water and the user comes in contact with the water. A ground fault may also be caused by damaged insulation within a structure. A GFCI is configured to sense dangerous conditions such as these and respond quickly. Under normal operating conditions, the current flowing in the hot conductor should equal the current in the neutral conductor. Thus, GFCIs typically compare the current in the hot conductor to the return current in the neutral conductor by sensing the differential current between the two conductors. When a ground fault occurs, the current flowing in the hot conductor does not equal the current in the neutral conductor, differing by the amount of the unintended ground fault current. The GFCI may respond by actuating an alarm and/or interrupting the circuit. Circuit interruption is typically effected by opening the line between the source of power and the load.

Another type of fault may occur when the load neutral terminal, or a conductor connected to the load neutral terminal, becomes grounded. This condition does not represent an immediate shock hazard. Under normal conditions, a GFCI will trip when the differential current is greater than or equal to approximately 6 mA. However, when the load neutral conductor is grounded and the user comes in contact with the hot conductor, only a portion of the fault current through the user is diverted to ground. When this happens, it may take up to 30 mA of fault current through the user to produce 6 mA of differential current before the GFCI trips. Thus, when a double-fault condition occurs, i.e., when both the hot conductor and the load neutral are grounded, the GFCI may fail to trip, causing serious injury or death.

The GFCI includes components that can malfunction, unbeknownst to the user. When an internal fault has occurred, the GFCI may fail to trip during both the grounded hot fault condition and the grounded neutral fault condition.

In light of the above discussion, it is desirable to provide a GFCI that is capable of self-testing to assure that the GFCI is affording protection for both the grounded hot fault condition and the grounded neutral fault condition. In one approach that has been considered, a GFCI has been configured to include a timer that initiates a periodic self test of the GFCI. Alternatively, the GFCI initiates a periodic alarm to alert the user to manually push the test button on the GFCI. One drawback to this approach is that the circuitry is relatively expensive and increases the size of the GFCI circuitry.

In another approach that has been considered, a GFCI includes a visual indicator adapted to display a mis-wire condition. If the hot power source conductor and the neutral power source conductor are inadvertently mis-wired to the load terminals of the GFCI, the visual indicator is actuated to display the mis-wire alarm condition. Those of ordinary skill in the art will understand that a mis-wire condition of this type will result in a loss of GFCI protection at the duplex receptacles on the face of the GFCI. One drawback to this approach is that the GFCI does not include a self-test of the electrical circuit. Another drawback to this approach is that the visual display does not indicate a lock-out of load side power by the interrupting contacts. As such, the user is obliged to correctly interpret and take action based on appearance of the visual indicator.

In yet another approach that has been considered, a GFCI is configured to self-test the relay solenoid that opens the GFCI interrupting contacts when a fault condition is sensed. However, the self-test does not include a test of the electrical circuit.

In yet another approach that has been considered, the self-test is configured to detect the failure of certain components, such as the SCR. If a failure mode is detected, the device is driven to a lock-out mode, such that power is permanently de-coupled from the load.

In light of all of the approaches discussed above, there are many other types of failures, such as those involving the GFCI sensing circuitry, that require manual testing. Of course, manual testing requires a user to push the test button disposed on the GFCI. If a simulated fault condition is present, the GFCI trips out after the test button is pushed. This prompts the user to reset the GFCI. If the device fails to reset, the user understands that the device has failed and is in a lock-out condition. This approach has drawbacks as well. While regular testing is strongly encouraged by device manufacturers, in reality, few users test their GFCIs on a regular basis.

Therefore, there is a need for a GFCI that is configured to self-test the GFCI sensing circuitry. There is a further need for a GFCI that is adapted to self-test for both the grounded hot fault condition and the grounded neutral fault condition. Finally, there is a need for a self-testing GFCI which performs self-testing every half-cycle, during a time period when the SCR tripping mechanism does not conduct.

SUMMARY OF THE INVENTION

The present invention addresses the needs described above. A circuit protection device is connected between two lines of an AC power source. The device is configured to introduce a simulated fault every period during the half cycle that the trip SCR cannot conduct. If the device fails to detect the simulated fault, i.e., the self-test fails, the device is tripped on the next half cycle. In response to the failure of the self-test procedure, the device may light an indicator lamp and/or lock out the device reset mechanism.

One aspect of the present invention is a protection device for use in an AC power distribution system. The device is configured to be coupled between an AC power distribution system and at least one load. The device includes a test circuit configured to generate at least one simulated fault signal during a first predetermined half-cycle of said AC power. The at least one simulated fault signal includes a grounded neutral simulated fault signal. A detector circuit is coupled to the test circuit. The detector is configured to generate a detection signal in response to the at least one simulated fault signal. A fault checking mechanism is coupled to the detector. The fault checking mechanism is configured to generate a fault signal if the detection signal is not generated within a predetermined period of time. A circuit interrupter is coupled to the response mechanism. The circuit interrupter is configured to decouple the AC power distribution system from the at least one load in response to the fault signal.

In another aspect, the present invention includes a protection device for use in an AC power distribution system. The device is configured to be coupled between an AC power distribution system and at least one load. The device includes a simulated grounded neutral test circuit configured to transmit a simulated grounded neutral fault signal during a first predetermined half cycle of AC power. A ground fault sensor is coupled to the simulated grounded neutral test circuit. The ground fault sensor is configured to sense a ground fault condition and the simulated grounded neutral fault signal and provide a sensor signal in response thereto. A first detector is coupled to the ground fault sensor. The first detector is configured to generate a first detection signal in response to the sensor signal. A resonant tank is coupled to the first detector. The resonant tank is configured to generate a resonating signal in response to the first detection signal. The resonating signal indicates that protection device components are operational. A second detector is coupled to the resonant tank. The second detector is configured to generate a fault signal if the resonating signal is not detected by the second detector within a predetermined period of time.

In yet another aspect, the present invention includes a method for self-testing a protection device for use in an AC power distribution system. The device is configured to be coupled between an AC power distribution system and at least one load. The method includes the step of introducing a simulated ground neutral fault during a first predetermined half cycle of the AC power. An attempt is made to detect the introduced simulated grounded neutral fault during the first predetermined half cycle. A fault condition is signaled if the introduced simulated grounded neutral fault is not detected within a predetermined period of time.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
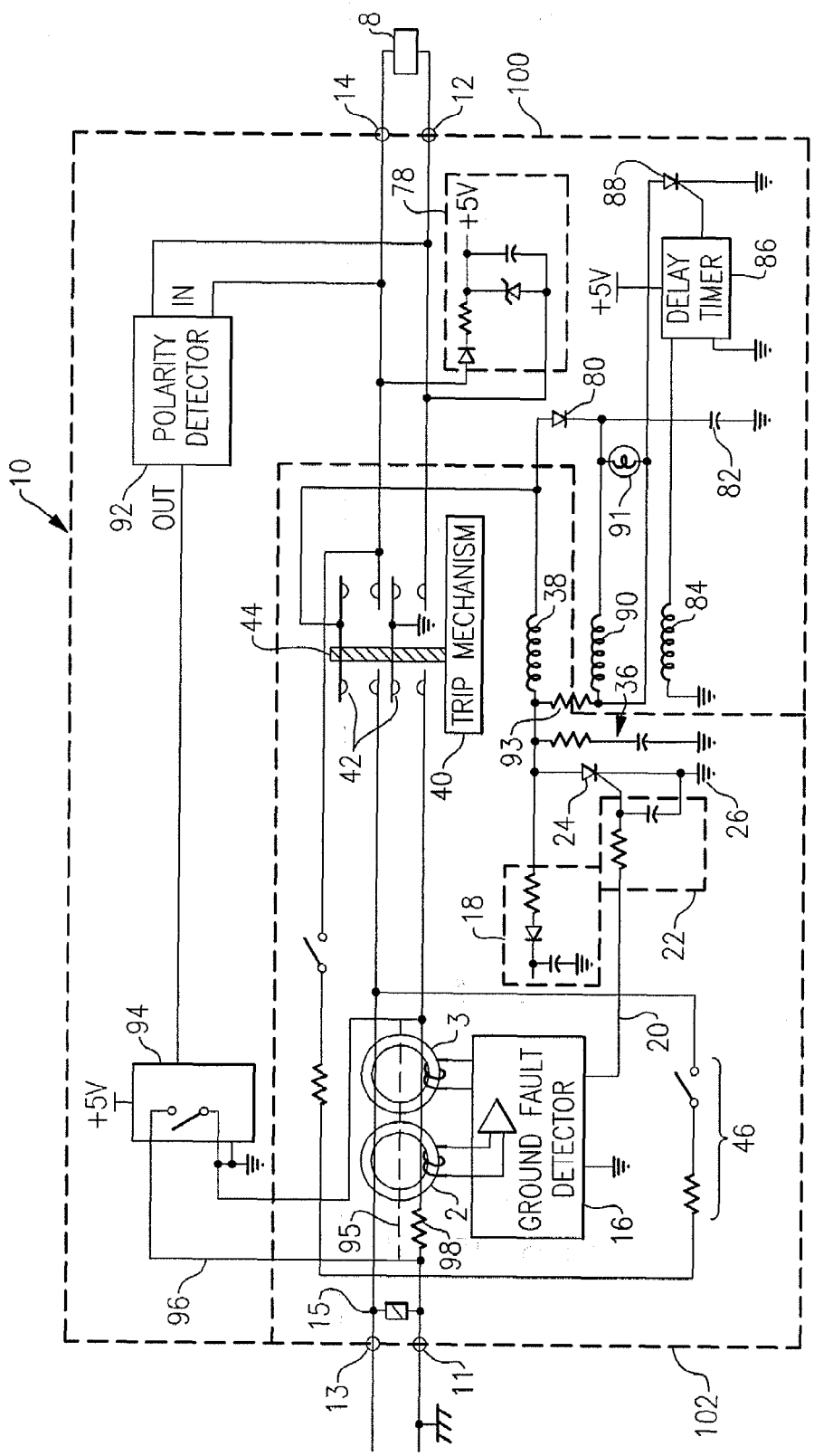
FIG. 1 is a block diagram of the circuit protection device in accordance with the present invention.

Reference will now be made in detail to the present embodiments of the invention, examples of which are illustrated in the accompanying drawings. Wherever possible, the same reference numbers will be used throughout the drawings to refer to the same or like parts. An exemplary embodiment of the protection device of the present invention is shown in FIG. 1, and is designated generally throughout by reference numeral 10.

As embodied herein, and depicted in FIG. 1, a block diagram of the circuit protection device in accordance with the present invention is disclosed. The block diagram of FIG. 1 is a GFCI 10 configured to introduce a simulated ground fault every period during the negative half cycle that the trip SCR cannot conduct. If the device fails to detect the simulated ground fault, i.e., the self-test fails, the device is tripped on the next positive half cycle.

As shown in FIG. 1, GFCI 10 protects an electrical circuit that provides electrical power to load 8. GFCI 10 is connected to the AC power source by way of line-side neutral terminal 11 and line-side hot terminal 13. GFCI 10 is coupled to load 8 by way of load side neutral terminal 12 and load-side hot terminal 14. GFCI 10 includes two main parts, Ground Fault Interrupt (GFI) circuit 102 and checking circuit 100.

GFI circuit 102 includes a differential sensor 2 that is configured to sense a load-side ground fault when there is a difference in current between the hot and neutral conductors. Differential sensor 2 is connected to detector circuit 16, which processes the output of differential sensor 2. Detector 16 is connected to power supply circuit 18. Power supply 18 provides power for allowing detector 16 to detect a ground fault during both the positive half-cycle and the negative half cycle of the AC power. As such, detector circuit 16 provides an output signal on output line 20. The output line 20 is coupled to SCR 24 by way of filter circuit 22. When detector circuit 16 senses a fault, the voltage signal on output line 20 changes and SCR 24 is turned ON. SCR 24 is only able to turn ON during the positive half cycles of the AC power signal. Further, snubber network 36 prevents SCR 24 from turning on due to spurious transient noise in the electrical circuit. When SCR 24 is turned ON, solenoid 38 is activated. Solenoid 38, in turn, causes the trip mechanism 40 to release the interrupter contacts 42. When interrupter contacts 42 are released, the load-side of GFCI 10 is decoupled from the line-side power source of the electrical circuit.

GFI circuit 102 also includes a grounded neutral transmitter 3 that is configured to detect grounded neutral conditions. Those skilled in the art understand that the conductor connected to neutral line terminal 11 is deliberately grounded in the electrical circuit. On the other hand, a grounded neutral condition occurs when a conductor connected to load neutral terminal 12 is accidentally grounded. The grounded neutral condition creates a parallel conductive path with the return path disposed between load terminal 12 and line terminal 11. When a grounded neutral condition is not present, grounded neutral transmitter 3 is configured to couple equal signals into the hot and neutral conductors. As noted above, differential sensor 2 senses a current differential. Thus, the equal signals provided by grounded neutral transmitter 3 are ignored. However, when a grounded neutral condition is present, the signal coupled onto the neutral conductor circulates as a current around the parallel conductive path and the return path, forming a conductive loop. Since the circulating current conducts through the neutral conductor but not the hot conductor, a differential current is generated. Differential sensor 2 detects the differential current between the hot and neutral conductors. As such, detector 16 produces a signal on output 20 in response to the grounded neutral condition.

The functionality of trip mechanism 40 is discussed in more detail below. Interrupter contacts 42 are coupled to trip mechanism 40. Interrupter contacts 42 are configured to selectively couple and decouple the load-side terminals (12, 14) from the corresponding line-side terminals (11, 13). In one embodiment, trip mechanism 40 is arranged in what is known in the art as a mouse trap arrangement. Interrupter contacts 42 include spring loaded contacts. When the trip mechanism 40 is activated, the spring-loaded contacts 42 are opened and latched in an open condition. Interrupter contacts 42 are manually reset (closed) by depressing reset button 44. Reference is made to U.S. Pat. No. 5,510,760, which is incorporated herein by reference as though fully set forth in its entirety, for a more detailed explanation of trip mechanism 40. In another embodiment, trip mechanism 40 and circuit interrupter 42 may be configured as a relay in which the contacts are normally open. In this alternative construction, when the trip mechanism 40 is de-activated, the contacts are biased open until such time as trip mechanism 40 is re-activated. As noted previously, GFCI 10 is configured to detect both ground faults and grounded neutral conditions.

As noted initially, GFCI 10 includes a checking circuit 100. Checking circuit 100 causes GFI 102 to trip due an internal fault also known as an end of life condition. Examples of an end of life condition include, but are not limited to, a non-functional sensor 2, grounded neutral transmitter 3, ground fault detector 16, filtering circuit 22, SCR 24, snubber 36, solenoid 38, or power supply 18. An internal fault may include a shorting or opening of an electrical component, or an opening or shorting of electrical traces configured to electrically interconnect the components, or other such fault conditions wherein GFI 102 does not trip when a grounded neutral fault occurs.

Referring to FIG. 1, checking circuit 100 includes several functional groups. The components of each group are in parenthesis. These functions include a fault simulation function (92, 94, 96), a power supply function 78, a test signal function (38, 80, 82, 84), a failure detection function (86), and failure response function (88, 90, 91).

Fault simulation is provided by polarity detector 92, switch 94, and test loop 96. Polarity detector 92 is configured to detect the polarity of the AC power signal, and provide an output signal that closes switch 94 during the negative half cycle portions of the AC power signal, when SCR 24 cannot turn on. Test loop 96 is coupled to grounded neutral transmitter 3 and ground fault detector 2 when switch 94 is closed. Loop 96 has less than 2 Ohms of resistance. Because polarity detector 92 is only closed during the negative half cycle, electrical loop 96 provides a simulated grounded neutral condition only during the negative half cycle. However, the simulated grounded neutral condition causes detector 16 to generate a fault detect output signal on line 20.

The test signal function provides an oscillating ringing signal that is generated when there is no internal fault condition. Capacitor 82 and solenoid 38 form a resonant circuit. Capacitor 82 is charged through a diode 80 connected to the AC power source of the electrical circuit. SCR 24 turns on momentarily to discharge capacitor 82 in series with solenoid 38. Since the discharge event is during the negative half cycle, SCR 24 immediately turns off after capacitor 82 has been discharged. The magnitude of the discharge current and the duration of the discharge event are insufficient for actuating trip mechanism 40, and thus interrupting contacts 42 remain closed. When SCR 24 discharges capacitor 40 during the negative AC power cycle, a field is built up around solenoid 38 which, when collapsing, causes a recharge of capacitor 82 in the opposite direction, thereby producing a negative voltage across the capacitor when referenced to circuit common. The transfer of energy between the solenoid 38 and capacitor 82 produces a test acceptance signal as a ringing oscillation. Winding 84 is magnetically coupled to solenoid 38 and serves as an isolation transformer. The test acceptance signal is magnetically coupled to winding 84 and is provided to reset delay timer 86.

The failure detection function is provided by delay timer 86 and SCR 88. Delay timer 86 receives power from power supply 78. When no fault condition is present, delay timer 86 is reset by the test acceptance signal during each negative half cycle preventing timer 86 from timing out. If there is an internal fault in GFI 102, as previously described, the output signal on line 20 and associated test acceptance signal from winding 84 which normally recurs on each negative half cycle ceases, allowing delay timer 86 to time out.

SCR 88 is turned on in response to a time out condition. SCR 88 activates solenoid 90 which in turn operates the trip mechanism 40. Subsequently, interrupter contacts 42 are released and the load-side terminals (12, 14) are decoupled from the power source of the electrical circuit. If a user attempts to reset the interrupting contacts by manually depressing the reset button 44, the absence of test acceptance signal causes GFI 10 to trip out again. The internal fault condition can cause GFI 10 to trip, and can also be indicated visually or audibly using indicator 91. Alternatively, solenoid 90 can be omitted, such that the internal fault condition is indicated visually or audibly using indicator 91, but does not cause GFI 10 to trip. Thus the response mechanism in accordance with the present invention can be a circuit interruption by circuit interrupter 40, an indication by indicator 90, or both in combination with each other.

Checking circuit 100 is also susceptible to end of life failure conditions. Checking circuit 100 is configured such that those conditions either result in tripping of GFI 102, including each time reset button 44 is depressed, or at least such that the failure does not interfere with the continuing ability of GFI 102 to sense, detect, and interrupt a true ground fault or grounded neutral condition. For example, if SCR 88 develops a short circuit, solenoid 90 is activated each time GFI 102 is reset and GFI 102 immediately trips out. If one or more of capacitor 82, solenoid 90 or winding 84 malfunction, an acceptable test signal will not be generated, and checking circuit 100 will cause GFI 102 to trip out. If polarity detector 92 or switch 94 are shorted out, the grounded neutral simulation signal is enabled during both polarities of the AC power source. This will cause GFI 102 to trip out. If polarity detector 92 or switch 94 open circuit, there is absence of grounded neutral simulation signal, and delay timer 86 will not be reset and GFI 102 will trip out. Solenoids 38 and 90 are configured to operate trip mechanism 40 even if one or the other has failed due to an end of life condition. Therefore if solenoid 90 shorts out, trip mechanism 40 is still actuatable by solenoid 38 during a true fault condition. If power supply 78 shorts out, power supply 18 still remains operational, such that GFI 102 remains operative.

Although much less likely to occur, some double fault conditions cause GFI 102 to immediately trip out. By way of illustration, if SCR 88 and SCR 24 simultaneously short out, solenoids 38 and 90 are both turned on, resulting in activation of trip mechanism 40.

In another embodiment, solenoid 90 can be omitted and SCR 88 reconnected as illustrated by dotted line 93. During a true fault condition, solenoid 38 is turned on by SCR 24; when an end of life condition in GFI 102 is detected by checking circuit 100, solenoid 38 is turned on by SCR 88. The possibility of a solenoid 38 failure is substantially minimized by connecting solenoid 38 to the load side of interrupting contacts 42.

As has been described, wire loop 96 includes a portion of the neutral conductor. A segment of the hot conductor can be included in electrical loop 96 instead of the neutral conductor to produce a similar simulation signal (not shown.)

Other modifications may be made as well. The neutral conductor (or hot) conductor portion has a resistance 98, typically 1 to 10 milliohms, through which current through load 8 flows, producing a voltage drop. The voltage drop causes a current in electrical loop 96 to circulate which is sensed by differential sensor 2 as a ground fault. Consequently, ground fault detector 16 produces a signal on output 20 due to closure of test switch 94 irrespective of whether or not an internal fault has occurred in neutral transmitter 3. In order to assure that grounded neutral transmitter 3 is tested for a fault by checking circuit 100, electrical loop 96 can be configured as before but not to include a segment of the neutral (or hot) conductor, as illustrated by the wire segment, shown as dotted line 95.

Figure 2:
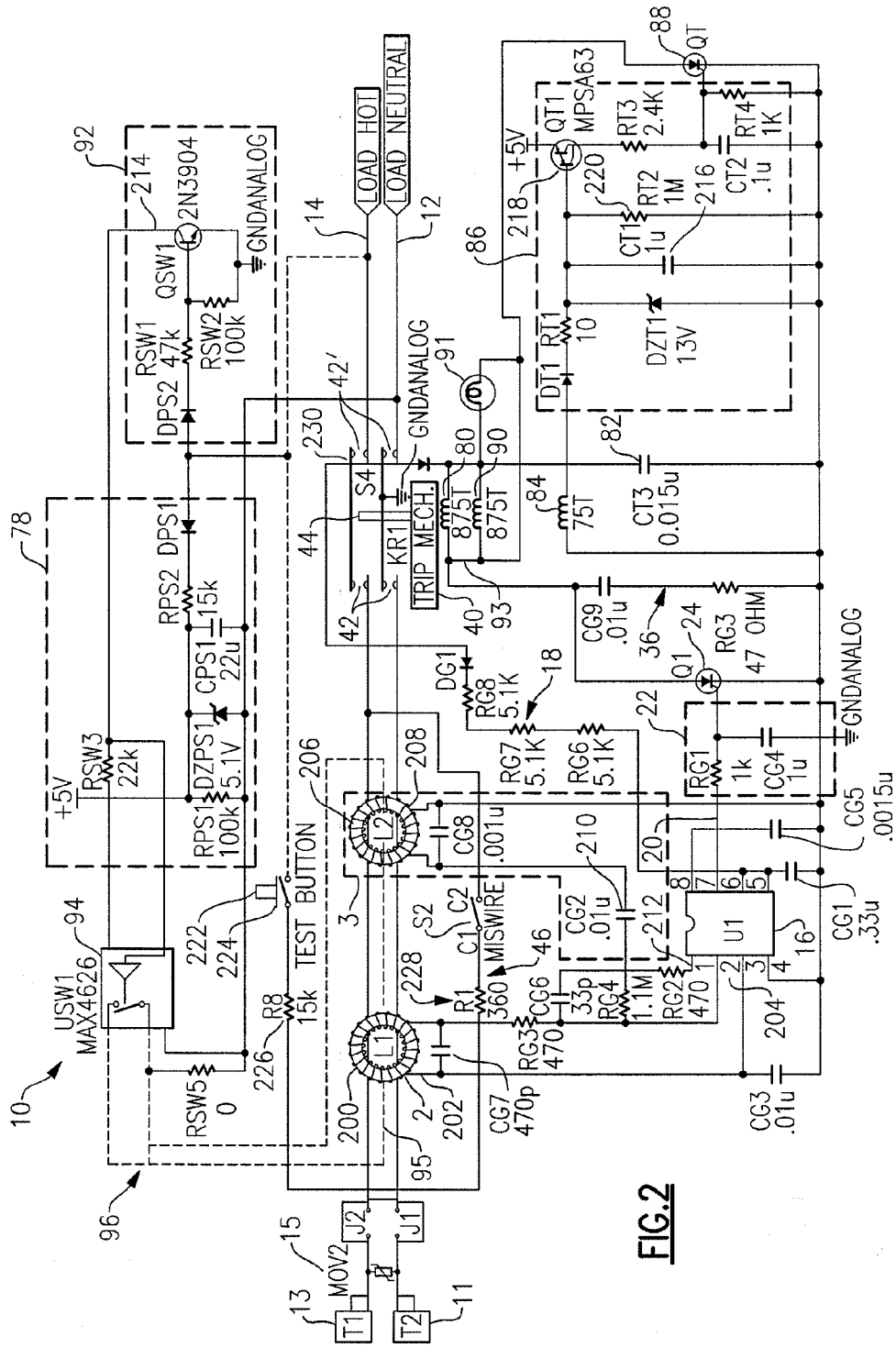
FIG. 2 is a circuit schematic of the diagram depicted in FIG. 1 in accordance with one embodiment of the present invention.

As embodied herein, and depicted in FIG. 2, a circuit schematic of the diagram depicted in FIG. 1 in accordance with one embodiment of the present invention is shown. In the embodiment of FIG. 2, ground fault detector 16 is an RV 4141 integrated circuit manufactured by Fairchild Semiconductor. Ground fault detector 2 is implemented as a toroidally shaped magnetic core 200 about which a winding 202 is wound. Winding 202, typically having 1,000 turns, is coupled to an input terminal 204 of ground fault detector 16. Grounded neutral transmitter 3 is implemented as a second toroidally shaped magnetic core 206 about which a winding 208 is wound. Winding 208, typically having 200 turns, is coupled in series with a capacitor 210 to the gain output terminal 212 of ground fault detector 16. Hot and neutral conductors 13 and 11, and wire segment 95 if used, pass through the apertures of cores 200 and 206.

During either a true grounded neutral condition, or during a simulated grounded neutral condition, low level electrical noise indigenous to the electrical circuit or to ground fault detector 16 creates a magnetic flux in either core 200 or 206, or both, flux in core 206 having been induced by winding 208. Core 206 induces a circulating current in electrical loop 96, which induces a flux in core 200. The resulting signal from winding 202 is amplified by the gain of ground fault detector 16 to produce an even greater flux in core 206 via winding 208. Through the regenerative feedback action as has been described, ground fault detector 16 breaks into oscillation, typically 5 to 10 kHz. The oscillation produces a signal on output 20 during a grounded neutral fault or simulated grounded condition as has been previously described.

As shown in FIG. 2, switch 94 may be implemented as an analog switch, such as USW1 MAX 4626, manufactured by Maxim Semiconductor. Polarity detector 92 may be implemented using transistor 214, which closes switch 94 during the negative half cycle portions of the AC power supply of the electrical distribution system.

Delay timer 86 includes a capacitor 216 which is configured to hold a pre-established voltage when test acceptance signals are properly received. The pre-established voltage prevents transistor 218 from turning SCR 88 ON. An end of life condition is signaled by the cessation of the test acceptance signal. In the absence of the test acceptance signal, the voltage on capacitor 216 decays below the pre-established voltage within a pre-established time interval, the rate of decay being established by bleeder 220. In response, transistor 218 actuates SCR 88 and GFI 102 is tripped. The pre-established time interval is chosen such that checking circuit 100 is not responsive to normal transient conditions that may exist in the electrical circuit, such as momentary or intermittent loss of AC power supply voltage or momentary voltage transients, but responsive solely to end of life conditions.

GFCI 10 may be equipped with a manually accessible test button 222 for closing switch contacts 224 for initiating a simulated grounded hot fault signal, or alternatively, a simulated grounded neutral fault signal. If GFI 10 is operational, closure of switch contacts 224 initiates a tripping action. The purpose of the test button feature may be to allow the user to control GFCI 10 as a switch for applying or removing power from load 8, in which case test button 22 and reset button 44 have been labeled "off" and "on" respectively. Usage of test button 222 does not affect the performance of checking circuit 100, or vice-versa.

GFCI 10 may also be equipped with a miswiring detection feature such as miswire network 46. Reference is made to U.S. Pat. No. 6,522,510, which is incorporated herein by reference as though fully set forth in its entirety, for a more detailed explanation of miswire network 46. Briefly stated, miswire network 46 is configured to produce a simulated ground fault condition. During the installation of GFCI 10 if the power source voltage is coupled to the line terminals 11 and 13 as intended, the current through network 46 causes GFI 102 to trip but the current through network 46 continues to flow, until such time as network 46 open circuits due to heating of a fusible component included in network 46. The fusible component may be implemented by resistor 228, configured to fuse in typically 1 to 10 seconds. When the fusible component opens, the GFCI is able to be reset. Subsequently, GFI 102 and checking circuit 100 operate in the previously described manner. However, if the power source is connected to the load terminals, i.e., if GFCI 10 is miswired during installation, GFI 102 trips as before, but interrupting contacts 42 immediately terminate the current flow through network 46, typically in less than 0.1 seconds. This time period is too brief an interval to cause the fusible component to fail. Thus, when GFCI 10 is miswired the fusible element in network 46 remains intact, and reset button 44 cannot effect a resetting action. GFCI 10 cannot be reset regardless of signals to or from checking circuit 100.

If GFCI 10 is properly wired and tested during an installation, miswire network 46 will fuse open and not be available to afford miswire protection if GFCI 10 happens to be re-installed. However, the checking circuit 100 can be configured to extend miswire protection to the re-installation. During the course of re-installation, the user depresses test button 222 to close contacts 224. If GFCI 10 has been miswired, power supply 78 is connected to the load side of interrupting contacts 42 and delay timer 86 receives power. Power supply 18 is connected to a bus bar 230 between interrupting contacts 42 and 42'. Since interrupting contacts 42' are open, ground fault detector 16 does not receive power, and test acceptance signal is not communicated by winding 84 to charge capacitor 216 to a voltage greater than the pre-determined threshold. As a result, transistor 218 turns SCR 88 ON, and solenoid 90 activates trip mechanism 40. Whenever the reset button is depressed, the trip mechanism is activated such that the interrupter contacts do not remain closed. Thus, the checking circuit 100 interprets a re-installation miswiring as it would an end-of-life condition. Thereafter, GFCI 10 can only be reset when it is re-installed and wired properly.

Figure 3:
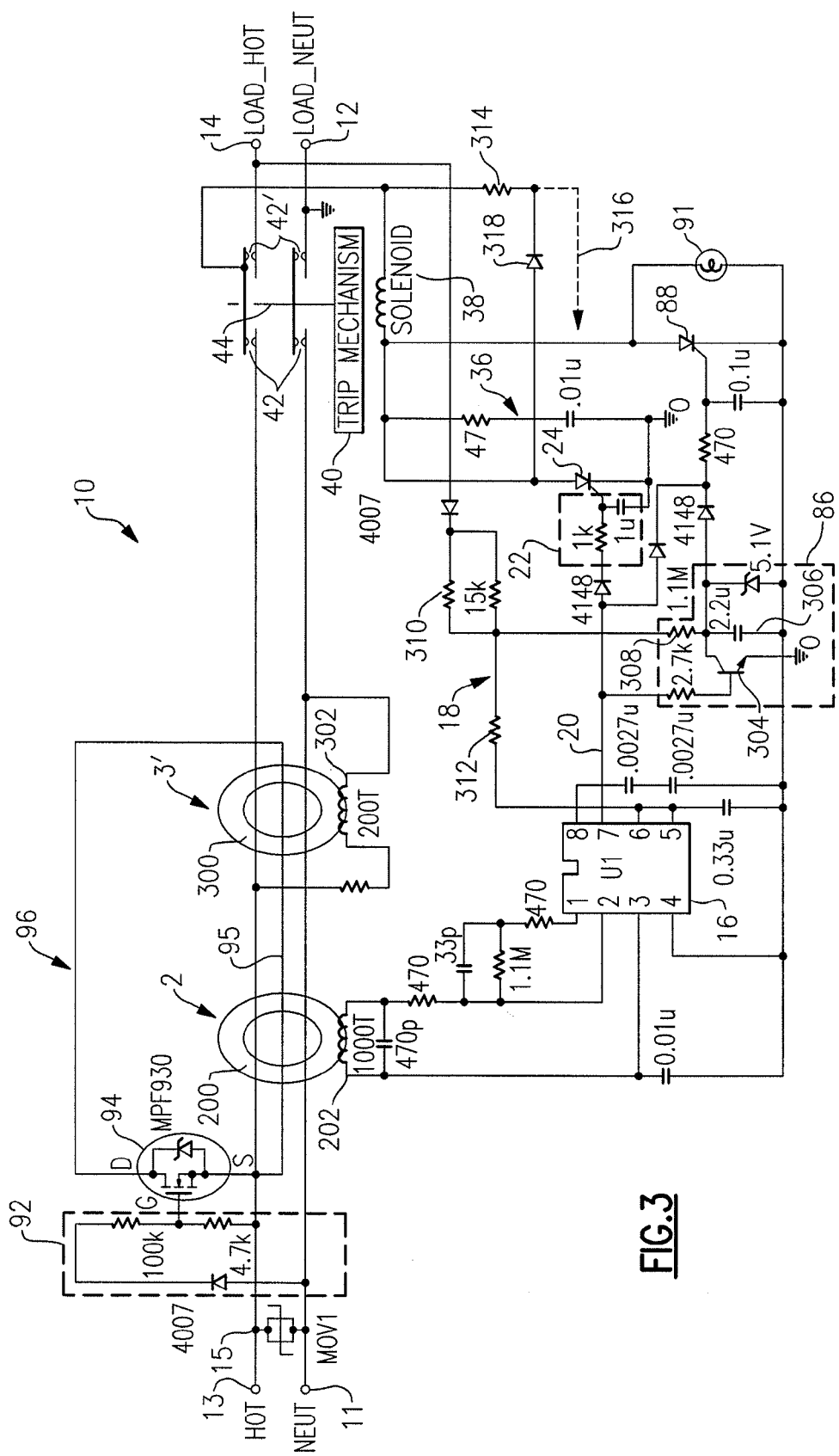
FIG. 3 is a circuit schematic of the diagram depicted in FIG. 1 in accordance with another embodiment of the present invention.

As embodied herein, and depicted in FIG. 3, a circuit schematic of the diagram depicted in FIG. 1 in accordance with another embodiment of the present invention is shown. Grounded neutral transmitter 3' includes a saturating core 300 and a winding 302 coupled to hot and neutral line terminals 13 and 11. During a true grounded neutral fault condition, saturating core 300 induces current spikes in the electrical loop 96. Reversals in the magnetic field in core 300 correspond to the zero crossings in the AC power source. The reversals in the magnetic field generate current spikes. Current spikes occurring during the positive-transitioning zero crosses produce a signal during the positive half cycle portions of the AC power source. The signal is sensed as a differential signal by ground fault sensor 2, and detected by ground fault detector 16. Subsequently, GFI 102 is tripped.

A simulated grounded neutral condition is enabled by polarity detector 92 and switch 94. Polarity detector 92 closes switch 94 during the negative half cycle. Thus, the current spikes occur during the negative half cycle portions but not during the positive half cycle portions of the AC power source. As described above, the output of detector 16 (line 20) during the negative half cycle portions of the AC power source are unable to turn on SCR 24. However, the output signal is used by checking circuit 100 to determine whether or not an end of life condition has occurred.

In yet another embodiment (not shown), the grounded neutral transmitter winding 208 can be connected to a local oscillator that provides a continuous oscillatory output signal regardless of the presence or absence of electrical loop 96. The frequency from the oscillator is typically 5 to 10 kHz. The oscillator induces a flux in core 206 via winding 208. The true grounded neutral fault couples the flux in core 206 into differential sensor 2, causing GFI 102 to trip as described above. The simulated grounded neutral condition, enabled by closure of switch 94 during the negative half cycle portions of the AC power source, provides for an end of life test signal, whose absence is interpreted by checking circuit 100 as an end of life condition.

It will be apparent to those of ordinary skill in the pertinent art that modifications and variations can be made to switch 94, but there is shown by way of example a MOSFET device, designated as MPF930 and manufactured by ON Semiconductor. In another embodiment, switch 94 may be monolithically integrated in the ground fault detector 16.

In response to a true ground fault or grounded neutral condition, ground fault detector 16 produces an output signal 20 during the positive half cycle portions of AC power source. The signal turns on SCR 24 and redundant SCR 88 to activate solenoid 38. Solenoid 38 causes trip mechanism 40 to operate.

When a simulated grounded neutral condition is introduced in the manner described above, a test acceptance signal is provided to delay timer 86 during the negative half cycle portions of the AC power source. Delay timer 86 includes a transistor 304 that discharges capacitor 306 when the test acceptance signal is received. Capacitor 306 is recharged by power supply 18 by way of resistor 308 during the remaining portion of the AC line cycle. Again, if there is an internal failure in GFCI 10, the test acceptance signal is not generated and transistor 304 is not turned on. As a result, capacitor 306 continues to charge until it reaches a predetermined voltage. At the predetermined voltage SCR 88 is activated during a positive half cycle portion of the AC power source signal. In response, solenoid 38 causes the trip mechanism 40 to operate. Alternatively, SCR 88 can be connected to a second solenoid 90 in the manner described in FIG. 2.

In the embodiment depicted in FIG. 3, both GFI 102 and checking circuit 100 derive power from power supply 18. Redundant components can be added such that if one component has reached end of life, another component maintains the operability of GFI 102, thereby enhancing reliability, or at least assuring the continuing operation of the checking circuit 100. For example, the series pass element 310 in power supply 18 can include parallel resistors. Resistor 312 can be included to prevent the supply voltage from collapsing in the event the ground fault detector 16 shorts out. Clearly, if the supply voltage collapses, delay timer 86 may be prevented from signaling an end of life condition. Those of ordinary skill in the art will recognize that there are a number of redundant components that can be included in GFCI 10, the present invention should not be construed as being limited to the foregoing example.

Alternatively, SCR 88 may be connected to an end of life resistor 314 as shown by dotted line 316, instead of being connected to solenoid 38 or 90. When SCR 88 conducts, the value of resistor 314 is selected to generate an amount of heat in excess of the melting point of solder on its solder pads, or the melting point of a proximate adhesive. The value of resistor 314 is typically 1,000 ohms. Resistor 314 functions as part of a thermally releasable mechanical barrier. When the solder pads are melted, resistor is dislodged causing the barrier to move, and trip mechanism 40 to operate. The actuation of the barrier causes interrupting contacts 42 and/or 42' to be permanently open. In other words, depressing reset button 44 will not close interrupting contacts (42, 42'). Reference is made to U.S. Pat. No. 6,621,388, which is incorporated herein by reference as though fully set forth in its entirety, for a more detailed explanation of resistor 314.

Since end of life resistor 314 affords a permanent decoupling of the load side of GFCI 10 from the AC power source, it is important that the end of life resistor 314 only dislodge when there is a true end of life condition and not due to other circumstances, such as transient electrical noise. For example, SCR 88 may experience self turn-on in response to a transient noise event. Coupling diode 318 may be included to decouple resistor 314 in the event of a false end of life condition. Coupling diode 318 causes SCR 88 to activate solenoid 38 when it is ON.

Referring to FIGS. 4a-4g, timing diagrams illustrating the operation of the circuits depicted in FIG. 2 and FIG. 3 are shown. FIGS. 4a through 4e pertain to the embodiment shown in FIG. 2. Referring to FIG. 4a, the AC power source signal is shown, having positive half cycles 400 and negative half cycles 402. Referring to detector 16 in FIG. 2, FIG. 4b represents the waveform at gain output terminal 212. Voltage signal 404 is the quiescent level when there is no grounded neutral condition, whether a simulated fault condition or true fault condition. The quiescent voltage level 404 is centered between pre-established voltage thresholds 406 and 406'. The threshold levels are established by ground fault detector 16. During each negative half cycle 402, switch 94 is closed to initiate the simulated grounded neutral signal resulting in the on-set of oscillation signal 408. The amplitude of the oscillation 410 may decay in relationship to the instantaneous voltage of power supply 18. FIG. 4c shows the output voltage signal 412 present on detector output line 20. The duration of each output signal 412 corresponds to the interval in which the voltage at gain output terminal 212 is either greater than threshold 406, or less than threshold 406'. Output signal 412 is detected by delay timer 86 as the above described test acceptance signal.

FIG. 4d represents a true grounded neutral condition that occurs in combination with the simulated grounded neutral condition. Those of ordinary skill in the art will recognize that the present invention functions equally well during a true ground fault or true arc fault condition. Referring back to FIG. 4d, an oscillation signal 416 is present during at least one positive half cycle 400 as a result of the fault condition. FIG. 4e is a representation of the voltage signal 418 at the output of filter 22. There are two things that are of note. First, voltage signal 418 occurs during the positive half cycle 400. Second, once voltage 418 is greater than voltage threshold 414, SCR 24 is turned ON, and GFI 102 is tripped out.

Figure 4:
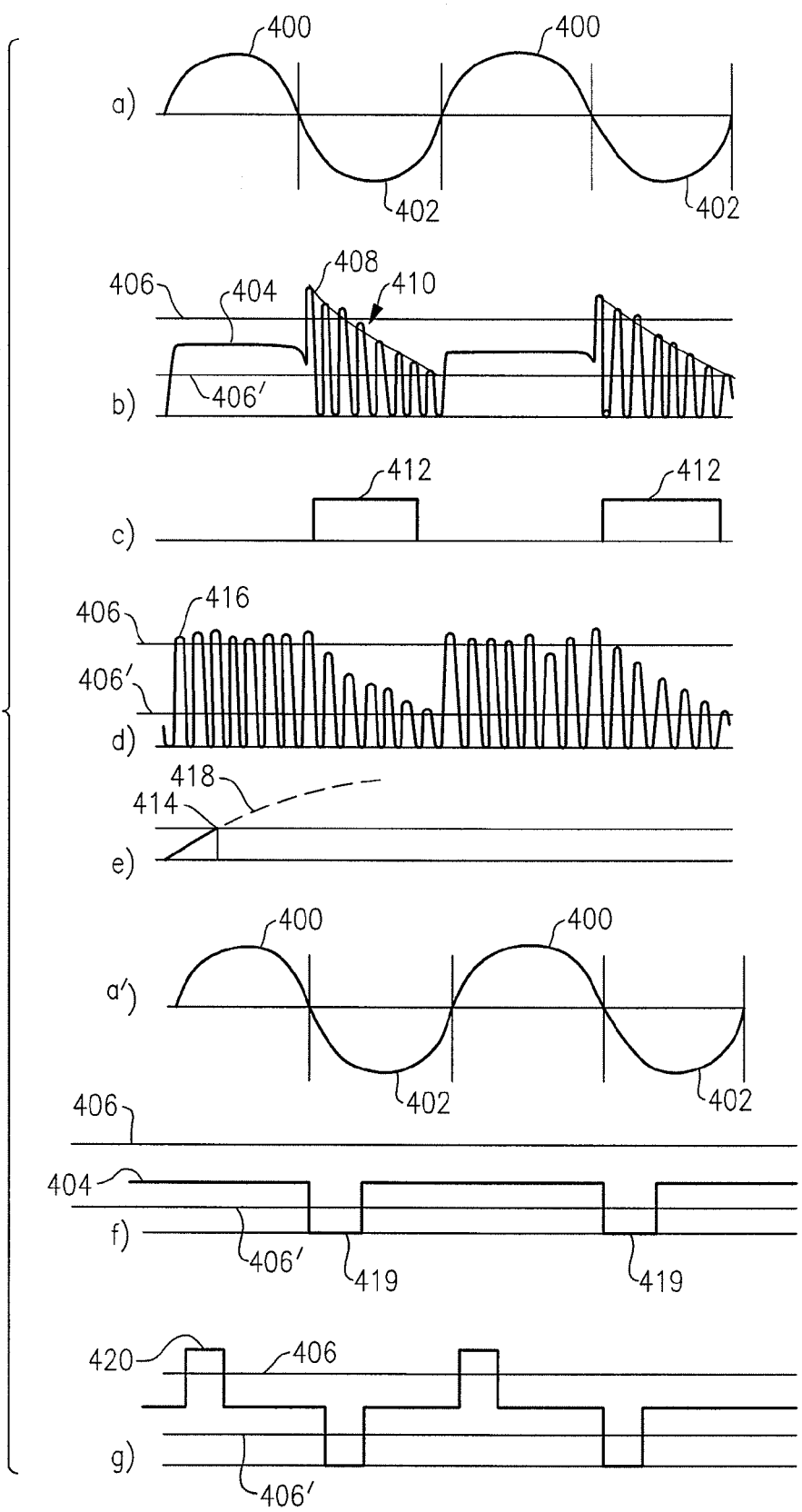
FIGS. 4a-4g include timing diagrams illustrating the operation of the circuits depicted in FIG. 2 and FIG. 3.

FIGS. 4a', 4f and 4g pertain to the embodiment of FIG. 3. As described above, the embodiment of FIG. 3 employs saturating neutral core 3'. FIG. 4a' is identical to FIG. 4a and repeated for the reader's convenience. FIG. 4f shows voltage signal 404 at the gain output terminal 212 during a simulated grounded neutral condition. Negative-tending impulses 419 correspond to each negative half cycle of the AC power source 402. The impulses shown in FIGS. 4f and 4g compared to the oscillation signals shown in FIGS. 4b and 4d produce similar results. During a true grounded neutral condition, there is additionally at least one positive-tending impulse 420 during a positive half cycle 400 of the AC power source. The results shown in FIG. 4 are equally applicable to a true ground fault condition or a true arc fault condition.

Figure 5:
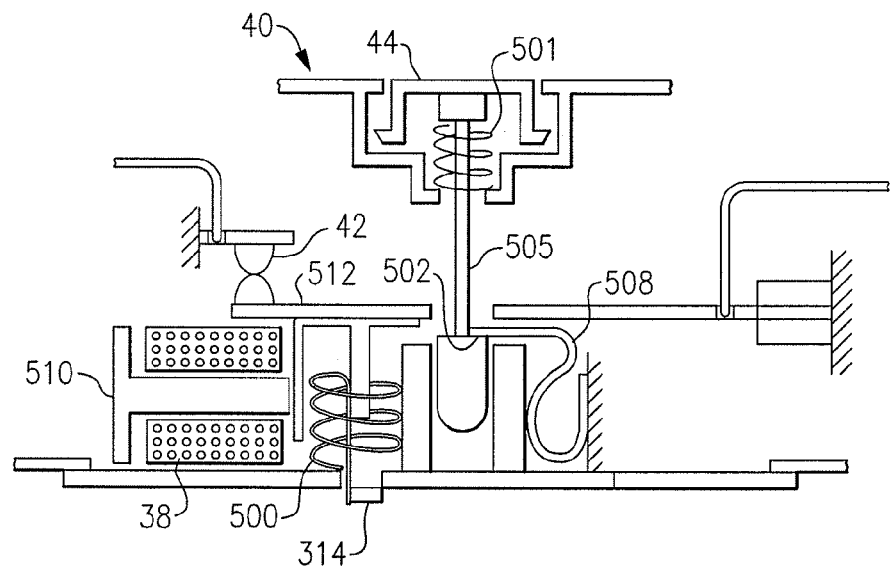
FIG. 5 is a sectional view of the lock-out mechanism.

As embodied herein, and depicted in FIG. 5, a sectional view of the lock-out mechanism 50 is depicted. During normal operation of GFCI 10, end of life resistor 314, shown schematically in FIG. 3, is physically configured to restrain lock-out spring 500. Resistor 314 is preferably mounted and soldered so that the body of resistor 314 impedes movement of lock-out spring 500. Trip mechanism 40 is shown in the reset state, meaning that contacts 42 are closed. Contacts 42 are held closed by action of a trapped make-force spring 501 acting on an escapement 502 on a reset stem, 505, attached to the reset button 44.

Figure 6:
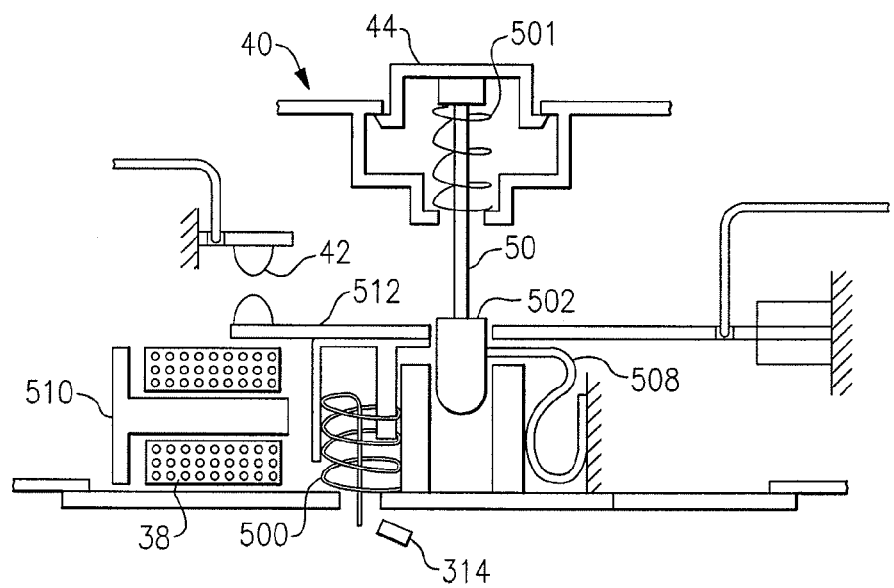
FIG. 6 is a sectional view of the lock-out mechanism in FIG. 5 is shown in a lock-out state.

Referring to FIG. 6, a sectional view of the lock-out mechanism depicted in FIG. 5 is shown in a lock-out state. In an end of life condition, solenoid 38 is not turned on by a true ground fault or grounded neutral fault. Consequently there is not a magnetic field to actuate plunger 510. Thus, contacts 42 remain closed. However, the checking circuit detects the end of life condition and turns on SCR 88. The resultant current flows through end of life resistor 314. After a predetermined period of time, the current heats resistor 314 until the melting point of solder or an adhesive is reached. At this point, the solder or adhesive fails, and the end of life resistor 314 is physically dislodged by the bias of lockout spring 500. Lockout spring 500 urges reset latch spring 508 to the right, releasing escapement 502 from latch spring 508. Plunger 505 moves upward because of the upward force applied by spring 501. As a result, contact arm 512, which can be a cantilever beam or as a bus bar, moves in a downward direction. As a result, contacts 42 are opened, i.e., a tripping action occurs. Any attempt to depress reset button 44 to reset contacts 42 is ineffective because latch spring 508 is held permanently in the trip position by lockout spring 500.

The end of life resistor 314 may allow failure modes in the test mechanism 40 to be protected by the checking circuit 100. By way of example, plunger 510 can become immobilized through dirt or corrosion such that the trip mechanism 40 is not operated when solenoid 38 or 90 is activated. As has been described, end of life resistor 314 provides for a secondary method of operating trip mechanism 40 that does not rely on a motion of plunger 510.

Figure 7:
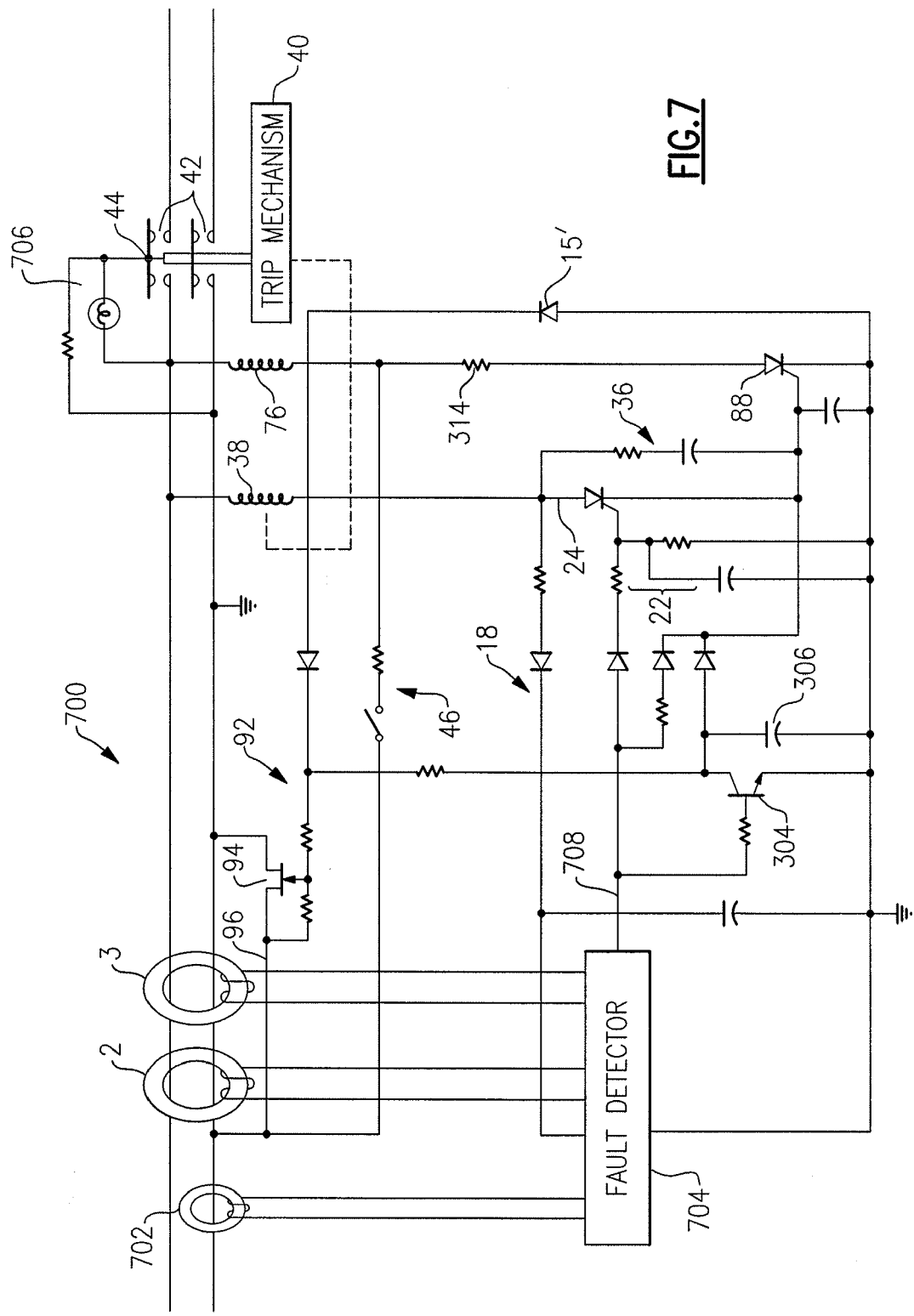
FIG. 7 is a circuit schematic in accordance with yet another embodiment of the present invention.

As embodied herein, and depicted in FIG. 7, a circuit schematic in accordance with yet another embodiment of the present invention is disclosed. Protective device 700 is configured to protect the electrical circuit from a plurality of fault conditions that include ground faults, grounded neutral faults, arc faults to ground, parallel arc faults between the line and neutral conductors, and series arc faults within a line or neutral conductor. Protective device 700 one or more additional sensors, such as sensor 702, to detect series arc faults and parallel line to neutral arc faults, since differential transformer 2 is configured to ignore all but differential currents. In one embodiment, sensor 702 is a current sensor configured to sense the current on the hot or neutral conductor. Fault detector 704 is similar to ground fault detector 16, but is also configured to detect and respond to other signals, such as arc recognition signatures. Output 708 operates in a manner similar to what has been described for output 20, but further provides trip signal for the above described fault conditions during the positive half cycle portions of the AC power source.

Other features are illustrated in FIG. 7 for convenience but are applicable to the other embodiments of the invention. Such features include a trip indicator 706 which illuminates or annunciates when protective device 700 is tripped.

The end of life lockout feature embodied in FIG. 7 allows solenoid 38 and power supply 18 to be connected to the line side of interrupting contacts 42 without sacrificing protection if solenoid 38 reaches end of life. In particular, solenoid 38 is configured to carry current only momentarily. A shorted or opened component may result in a continuous current being supplied. For example, this may occur when SCR 24 is shorted out. Since solenoid 38 is not coupled to the AC power source through interrupting contacts 42, the opening of the contacts fails to limit the duration of the current to prevent overheating of the solenoid. However, the current flowing through solenoid 38 also flows through SCR 24. As a result, SCR 88 is activated and power is applied to end of life resistor 314. As described above, the resistor will be heated to a temperature greater than the melting point of the solder, or proximate adhesive, and the resistor 314 will fail. Of course, this results in a lock-out condition wherein interrupting contacts 42 are permanently opened. Thus, the end of life lockout feature is effective even if solenoid 38 is impaired through over activation.

In yet another feature, an auxiliary impedance 710, preferably including an inductance, couples power from the AC power source to polarity detector 92 and miswire network 46. The value of impedance 710 is chosen to be greater than 50 Ohms in the presence of high frequency impulse noise on the electrical circuit, such as caused by lightning activity. The impedance permits a small metal oxide varistor 15', rated less than one Joule, to protect polarity detector 92 and miswire network 46 from damage. Likewise, the inductance of solenoid 38 is chosen such that snubber network 36 protects SCR 24 and power supply 18 from damage. The use of an auxiliary impedance in combination with other impedances, such as the impedance of a solenoid, is an alternative design that avoids using an across-the-line metal oxide varistor such as MOV 15 in FIG. 1. An across-the-line varistor is typically greater than 12 mm in size. The excessive size is a result of a requirement that the varistor successfully absorb the full energy of the voltage impulse. As shown, auxiliary impedance 710 is a stand-alone component, but could have been shown as sharing one of the magnetic cores of the inductors that have been previously described.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A protection device for use in an AC power distribution system, the device being configured to be coupled between an AC power distribution system and at least one load, the device comprising:
    a test circuit configured to generate at least one simulated fault signal during a first predetermined half-cycle of said AC power, the at least one simulated fault signal including a grounded neutral simulated fault signal;
    a detector circuit coupled to the test circuit, the detector being configured to generate a detection signal in response to the at least one simulated fault signal;
    a fault checking mechanism coupled to the detector, the fault checking mechanism being configured to generate an internal fault signal if the detection signal is not generated within a predetermined period of time; and
    a response mechanism coupled to the fault checking mechanism, the response mechanism being configured to generate a response if the internal fault signal is generated.

2. The protection device of claim 1, wherein the response mechanism includes a circuit interrupter being configured to decouple the AC power distribution system from the at least one load.

3. The protection device of claim 2, wherein the detector circuit further comprises a ringing circuit configured to generate a ringing signal.

4. The protection device of claim 3, wherein the detection signal includes the ringing signal.

5. The protection device of claim 1, wherein the detector circuit further comprises a ground fault sensor configured to sense a ground fault condition.

6. The protection device of claim 1, wherein the detector circuit further comprises a grounded neutral sensor configured to detect grounded neutral conditions.

7. The protection device of claim 1, wherein the fault checking mechanism does not generate the internal fault signal when the detection signal is detected within a predetermined period of time.

8. The protection device of claim 2, wherein the detector circuit generates the detection signal during a second predetermined half-cycle in response to a fault in the AC power distribution system, the detection signal being configured to trip the circuit interrupter during the second predetermined half-cycle.

9. The protection device of claim 2, wherein the circuit interrupter includes a first and second solenoid, the first solenoid being activated by the fault checking mechanism, the second solenoid being activated by a fault in the AC power distribution system.

10. The protection device of claim 2, wherein said circuit interrupter includes a reset mechanism configured to reset the circuit interrupter after the AC power distribution system has been decoupled from the at least one load, such that the AC power distribution system is re-coupled to the at least one load.

11. The protection device of claim 10, further comprising a lock-out mechanism coupled to the rest mechanism, the lock-out mechanism being configured to prevent the reset mechanism from resetting if the AC power distribution system was decoupled from the at least one load in response to the internal fault signal.

12. The protection device of claim 10, further comprising:
    line terminals for electrical connection to the AC power distribution system;
    load terminals for electrical connection to the load;
    a power supply coupled to the detector and fault checking mechanism, the power supply being configured to provide power to the protection device and prevent reset of the protection device if the load terminals are miswired to the AC power distribution system.

13. The protection device of claim 2, further comprising a miswire prevention circuit configured to trip the circuit interrupter if the load terminals are miswired to the AC power distribution system.

14. The protection device of claim 13, further comprising at least one auxiliary impedance circuit configured to protect the miswire prevention circuit from high frequency voltage impulses.

15. The protection device of claim 1, wherein said response mechanism includes an indicator for indicating the existence of a fault within said protection device.

16. The protection device of claim 15, wherein the response mechanism includes an audible indicator.

17. The protection device of claim 15, wherein the response mechanism includes an visual indicator.

18. The protection device of claim 2, wherein said response mechanism includes an indicator for indicating the existence of a fault within said protection device.

19. The protection device of claim 18, wherein the response mechanism includes an audible indicator.

20. The protection device of claim 18, wherein the response mechanism includes an visual indicator.

21. The protection device of claim 2, wherein said fault checking mechanism includes a lock-out mechanism configured to prevent the circuit interrupter from being reset if there is a fault condition within the protection device.

22. The protection device of claim 1, wherein said fault checking mechanism includes a lock-out mechanism configured to prevent the circuit interrupter from being reset if the detection signal is not generated within a predetermined period of time.

23. The protection device of claim 1, further comprising:
a first power supply coupled to the detector circuit; and
a second power supply coupled to the fault checking mechanism, the operation of the fault checking mechanism being independent from the first power supply.

24. The protection device of claim 1, further comprising a power supply coupled to the detector and the fault checking mechanism, the power supply including redundant components.

25. The protection device of claim 2, further comprising a trip light indicator configured to light when the circuit interrupter is tripped.

26. The protection device of claim 1, further comprising at least one auxiliary impedance circuit configured to protect the test circuit, detector, and/or fault checking mechanism from high frequency voltage signals.

27. The protection device of claim 1, wherein the test circuit further comprises a grounded neutral simulation circuit.

28. The protection device of claim 1, wherein said protection device is at least one of a GFCI device, a GFEP device, and an AFCI device.

29. A self testing protection device for use in an AC power distribution system, the device being configured to be coupled between an AC power distribution system and at least one load, the device comprising:
a simulated grounded neutral test circuit configured to transmit a simulated grounded neutral fault signal during a first predetermined half cycle of AC power;
a ground fault sensor coupled to the simulated grounded neutral test circuit, the ground fault sensor being configured to sense a ground fault condition and the simulated grounded neutral fault signal and provide a sensor signal in response thereto;
a first detector coupled to the ground fault sensor, the first detector being configured to generate a first detection signal in response to the sensor signal;
a resonant tank coupled to the first detector, the resonant tank being configured to generate a resonating signal in response to the first detection signal, the resonating signal indicating that protection device components are operational; and
a second detector coupled to the resonant tank, the second detector being configured to generate an internal fault signal if the resonating signal is not detected by the second detector within a predetermined period of time.

30. The protection device of claim 29, wherein said resonant tank further comprises:
a circuit interrupter configured to decouple the AC power distribution system and at least one load;
a trip solenoid configured to trip the circuit interrupter;
a switch configured to actuate the trip solenoid only during a second predetermined half cycle of said AC power source; and
a capacitor configured to energize the resonant tank during the first predetermined half cycle of AC power.

31. The protection device of claim 30, wherein the switch is selected from a group comprising a SCR and an electronic switch.

32. The protection device of claim 29, wherein the internal fault signal is configured to actuate the trip solenoid.

33. The protection device of claim 29, further comprising a reset mechanism, the reset mechanism being configured to reset the circuit interrupter such that the AC power distribution system is re-coupled to the at least one load.

34. The protection device of claim 33, wherein the internal fault signal is configured to disable the reset mechanism and prevent the protection device from being reset.

35. The protection device of claim 34, wherein the second detector includes an indicator that is energized in response to the fault signal.

36. The protection device of claim 29, wherein the second detector includes an indicator that is energized in response to the fault signal.

37. The protection device of claim 29, wherein the fault signal is configured to prevent the protection device from being reset.

38. The protection device of claim 29, wherein said protection device is at least one of a GFCI device, a GFEP device, and an AFCI device.

39. A method for self-testing a protection device for use in an AC power distribution system, the device being configured to be coupled between an AC power distribution system and at least one load, the method comprising:
introducing a simulated ground neutral fault during a first predetermined half cycle of the AC power;
attempting to detect the introduced simulated grounded neutral fault during the first predetermined half cycle; and
signaling a fault condition if the introduced simulated grounded neutral fault is not detected within a predetermined period of time.

* * * * *